United States Patent [19]

Yokouchi

[11] Patent Number: 5,235,520

[45] Date of Patent: Aug. 10, 1993

[54] INTEGRATED CIRCUIT HAVING A FUNCTION FOR GENERATING A CONSTANT VOLTAGE

[75] Inventor: Hideaki Yokouchi, Nagano, Japan

[73] Assignee: Seiko Epson Corporation, Tokyo, Japan

[21] Appl. No.: 595,967

[22] Filed: Oct. 11, 1990

[30] Foreign Application Priority Data

Oct. 20, 1989 [JP] Japan .................................. 1-273068
Sep. 10, 1990 [JP] Japan .................................. 2-237045

[51] Int. Cl.$^5$ ............................................ G05F 1/613
[52] U.S. Cl. .................................... 364/480; 323/223; 323/311
[58] Field of Search ............... 323/223, 275, 311, 314, 323/316; 364/480; 368/66

[56] References Cited

U.S. PATENT DOCUMENTS

| | | | |
|---|---|---|---|
| 4,288,739 | 9/1981 | Nercessian | 323/275 |
| 4,395,138 | 7/1983 | Chihara | 368/66 X |
| 4,476,428 | 10/1984 | Iwasawa et al. | 323/316 X |

FOREIGN PATENT DOCUMENTS

| | | |
|---|---|---|
| 56-168185 | 12/1981 | Japan . |
| 2061645 | 5/1980 | United Kingdom . |
| 2078021 | 12/1981 | United Kingdom . |
| 2079498 | 1/1982 | United Kingdom . |

OTHER PUBLICATIONS

Electronic Instrumentation and Measurements, David A. Bell, pp. 450, 451.

Primary Examiner—Edward R. Cosimano
Attorney, Agent, or Firm—Ladas & Parry

[57] ABSTRACT

Disclosed is an integrated circuit which comprises: a constant voltage circuit including a reference voltage generator, a feedback amplifier, a differential amplifier having an input for receiving an output signal of the reference voltage generator as a reference signal and another input for receiving an output of the feedback amplifier as a negative feedback signal, and a mono-channel output driver driven in accordance with an output of the differential amplifier; a circuit load connected to an output of the constant voltage circuit; and an MOS transistor connected in parallel to the circuit load and arranged so as to be driven when a heavy load is periodically driven. The MOS transistor is turned on in a heavy load operation to thereby rapidly discharge a charge in the capacitance of the constant voltage circuit and a charge in the capacitance in the circuit load are rapidly discharged so that an output of the feedback amplifier is made to cope with the fluctuation in voltage, whereby the mono-channel output driver in the output stage is properly controlled to suppress the fluctuation in output even when a power source fluctuates.

10 Claims, 5 Drawing Sheets

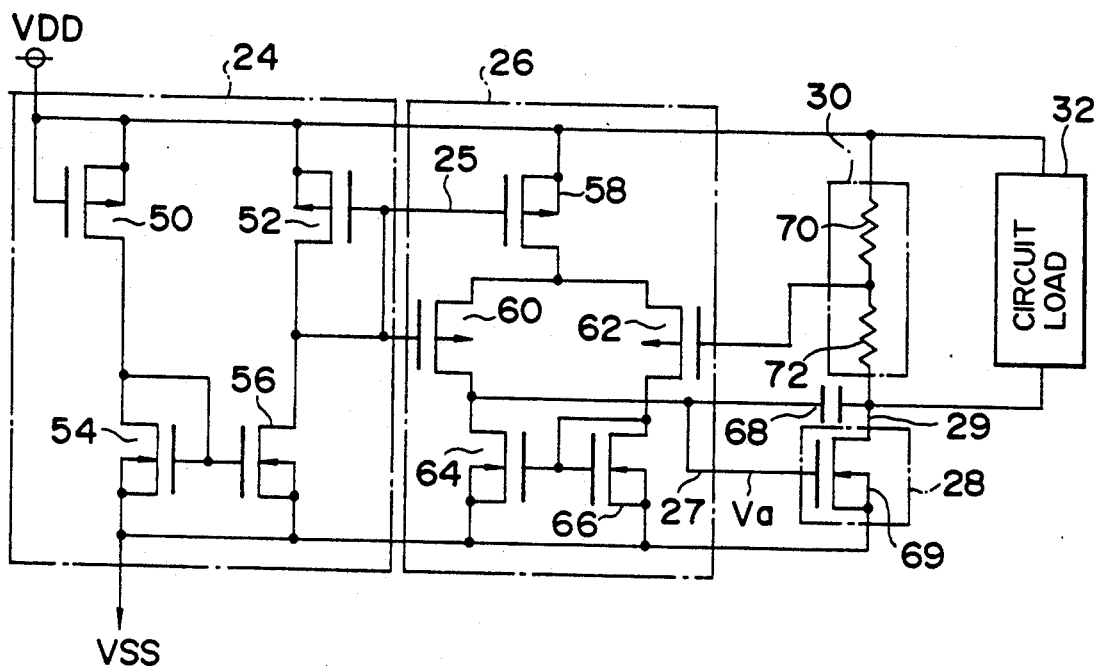
FIG. 1
*PRIOR ART*
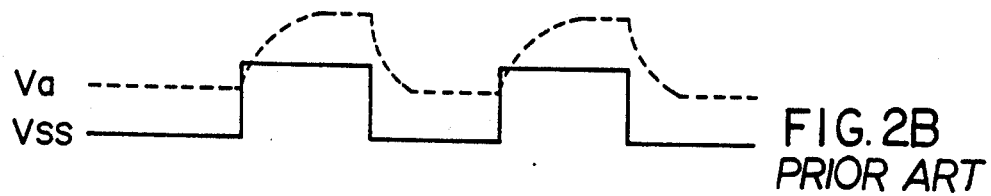
FIG. 2A
*PRIOR ART*
FIG. 2B
*PRIOR ART*
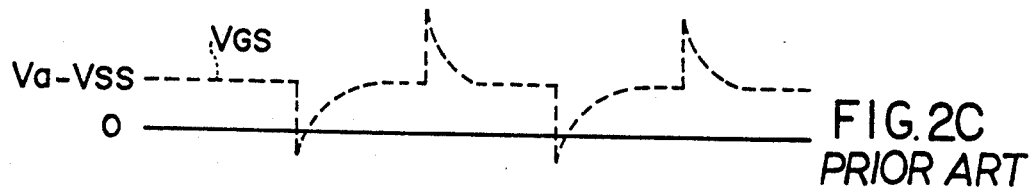
FIG. 2C
*PRIOR ART*

INTEGRATED CIRCUIT HAVING A FUNCTION FOR GENERATING A CONSTANT VOLTAGE

BACKGROUND OF THE INVENTION

The present invention generally relates to an integrated circuit (hereinafter abbreviated to "IC"), and particulary relates to an IC which includes a constant voltage circuit and which is required to have a low power consumption, for example, like an IC for a clock.

Conventionally, there has been a constant voltage circuit for such an IC of the kind described above, which is constituted by a reference voltage generator, a differential amplifier, a mono-channel output driver, and a negative feedback amplifier. The reason why the output driver is constituted to have a mono-channel is that it is possible to reduce the current consumption at an output driver portion by omitting an output driver on a P channel side.

In such a conventional constant voltage circuit as described above, however, there is a defect in that since no output driver is provided on the P channel side, the constant voltage output cannot be kept stable in case of occurrence of periodical fluctuations in a source voltage to thereby cause erroneous operation of the IC or deterioration in characteristics of the IC. For example, in the case of an IC, for example, for use for a clock, using a battery and having a buzzer output function, the source voltage supplied to the IC becomes small during the buzzing operation. This is because, during the buzzing operation, the current load of the battery becomes large so that the voltage drop due to the inside impedance of the battery becomes large correspondingly.

In case of occurrence of such fluctuations in power source, there occurs a phenomenon that the output of the constant voltage circuit becomes accumulatively large so that the output of the constant voltage circuit becomes impossible to converge to a fixed value and becomes larger than that in a normal condition. When the constant voltage output is used in a liquid crystal display, the contrast of display becomes so intensive in buzzing operation that deterioration of display quality may be caused. Thus, in the conventional constant voltage circuit, there has been a problem in that the output voltage of the constant voltage circuit cannot be kept stable in heavy load driving.

SUMMARY OF THE INVENTION

It is therefore and object of the present invention to provide an IC having a constant voltage circuit which is improved so that the output voltage thereof is kept stable even in heavy load driving.

In order to achieve the above object, according to an aspect of the present invention, the integrated circuit comprises; a constant voltage circuit including a reference voltage generator, a feedback amplifier, a differential amplifier having an input for receiving an output signal of the reference voltage generator as a reference signal and another input for receiving an output of the feedback amplifier as a negative feedback signal, and a mono-channel output driver driven in accordance with an output of the differential amplifier a circuit load connected to an output of the constant voltage circuit and an MOS transistor connected in parallel to the circuit load and arranged so as to be driven when a heavy load is periodically driven.

The MOS transistor connected parallel to the circuit load is turned on a heavy load operation to thereby rapidly discharge charges in the capacitance of the constant voltage circuit and charges in the capacitance in the circuit load so as make the output of the feedback amplifier loop with the fluctuation in voltage, so that the mono-channel output driver in the output stage is properly controlled to suppress the occurrence of fluctuations in the output even when a power source fluctuates.

According to another aspect of the present invention, the constant voltage circuit includes:

a) a first MOS transistor having a source connected to a first power source, and a gate supplied with a constant voltage on the basis of the first power source;

b) a second first-conductive-type MOS transistor having a source connected to a drain of the first first-conductive-type MOS transistor and a gate supplied with a constant voltage as a reference voltage on the basis of the first power source;

c) a third first-conductive-type MOS transistor having a source connected to the drain of the first first-conductive-type MOS transistor;

d) a first second-conductive-type MOS transistor having a source connected to a second power source, a drain connected to the second first-conductive-type MOS transistor, and a gate supplied with a voltage having the same potential as that of a drain of the third first-conductive-type MOS transistor;

e) a second second-conductive-type MOS transistor having a source connected to the second power source, a drain connected to the drain of the third first-conductive-type MOS transistor, and a gate supplied with a voltage having the same potential as that of the drain of the third first-conductive-type MOS transistor; and f) a third second-conductive-type MOS transistor having a source connected to the second power source, a gate supplied with a voltage having the same potential as that of the drain of the second first-conductive-type MOS transistor, and a drain connected to a gate of the third first-conductive-type MOS transistor and to at least one load.

According to a further aspect of the present invention, the constant voltage circuit includes; the MOS transistor connected in parallel to the circuit load is constituted by a fourth first-conductive-type MOS transistor having a source connected to the first power source and a drain connected to the drain of the third second-conductive-type MOS transistor.

According to a still further aspect of the present invention, the integrated circuit further comprises a switching means for turning ON/OFF at least one of the first and second power sources.

The above and other objects as well as advantageous features of the invention will become more clear from the following description taken in conjunction with the drawings.

BRIEF DESCRIPTION OF THE DRAWINGS

FIG. 1 is a circuit diagram of a conventional constant voltage circuit;

FIGS. 2A, 2B, 2C, 3 and 4 are timing charts showing the operation of the constant voltage circuit of FIG. 1;

DESCRIPTION OF THE PREFERRED EMBODIMENTS

Figure 3:
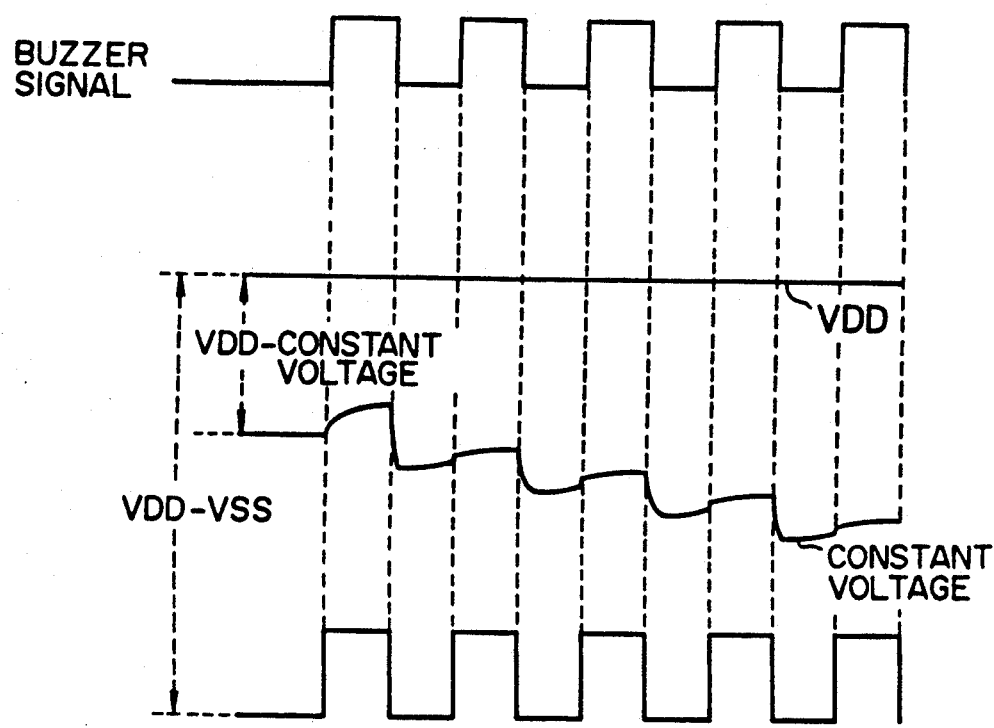

Prior to description of preferred embodiments of the present invention, in order to facilitate the better understanding of the embodiments of the invention, a conventional IC will be described while referring to the drawings.

FIG. 1 is a circuit diagram showing an example of a constant voltage circuit of a conventional IC. As shown in the drawing, the conventional constant voltage circuit is constituted by a reference voltage generator circuit 24, a differential amplifier 26, a mono-channel output driver 28, and a negative feedback amplifier portion 30. The reference voltage generator 24 is constituted by a depression type PMOS transistor 50, an enhancement type PMOS transistor 52, and enhancement type NMOS transistors 54 and 56. The differential amplifier circuit 26 is constituted by enhancement type PMOS transistors 58, 60, and 62 and enhancement type NMOS transistors 64 and 66. The mono-channel output driver 28 is constituted by an enhancement type NMOS transistor 69. The negative feedback amplifier portion 30 is constituted by a series connection of resistors 70 and 72 connected in parallel to a circuit load 32. The connection point between the resistors 70 and 72 is connected to a gate of the PMOS transistor 62.

In the reference voltage generator 24, if the depression type PMOS transistor 50 and the enhancement type PMOS transistor 52 are established so as to be equal in transistor size to each other, and the enhancement type NMOS transistors 54 and 56 are established so as to be equal in transistor size to each other, the difference between the respective threshold voltages of the PMOS transistors 52 and 50 is outputted as a reference voltage 25 composed of a constant voltage with a source voltage $V_{DD}$ as a reference electric potential. The reference voltage 25 is applied to a gate of the PMOS transistor 60 which is a non-inversion input of the differential amplifier circuit 26. The output from a drain 29 of the mono-channel output driver 28 is supplied as negative feedback, through the voltage-dividing register 72, to a gate of the PMOS transistor 62 which is an inversion input of the differential amplifier circuit 26. Thus, a constant voltage is outputted from the drain 29 of the monochannel output driver 28 so as to be supplied to the circuit load 32.

The reason why the output driver is constituted to have a mono-channel is that, as described above, it is possible to reduce the current consumption at an output driver portion by omitting an output driver on a P channel side.

In such a conventional constant voltage circuit as described above, however, there is a defect in that since no output driver is provided on the P channel side, the constant voltage output cannot be kept stable in case of occurrence of fluctuations in a source voltage to thereby cause erroneous operation of the IC or deterioration in characteristics of the IC. For example, in the case of an IC, for example, for use for a clock, using a battery and having a buzzer output function, the source voltage supplied to the IC becomes small during the buzzing operation. This is because, during the buzzing operation, the current load of the battery becomes large so that the voltage drop due to the inside impedance of the battery becomes large correspondingly.

FIGS. 2A, 2B and 2C are a timing charts showing the operation when the source voltage supplied to the IC becomes periodically low. When the source voltage $V_{DD}$-$V_{SS}$ becomes low, an output $V_a$ 27 of the differential amplifier circuit 26 fluctuates. As shown in FIG. 2, the output $V_a$ 27 is delayed by the influence of the capacitance 68 of the circuit per se and the capacitive component of the circuit load 32. Accordingly, a gate-source voltage $V_{GS}$ of the N-channel output driver 28 does not become constant.

The value of the gate-source voltage $V_{GS}$ becomes large at the instant the source voltage $V_{DD}$-$V_{SS}$ returns to the original value. When the value of the gate-source voltage $V_{GS}$ becomes high, the driving ability of the N-channel output driver 28 becomes large so that the output of the N-channel output driver 28 is pulled to the $V_{SS}$ side. If the frequency of fluctuations of the source voltage is low, the constant voltage output pulled toward the $V_{SS}$ converges to a constant value at last. When the frequency of fluctuations of the source voltage is high, however, the constant voltage output is pulled again toward the $V_{SS}$ side before the constant voltage output converges to a constant value.

Figure 4:
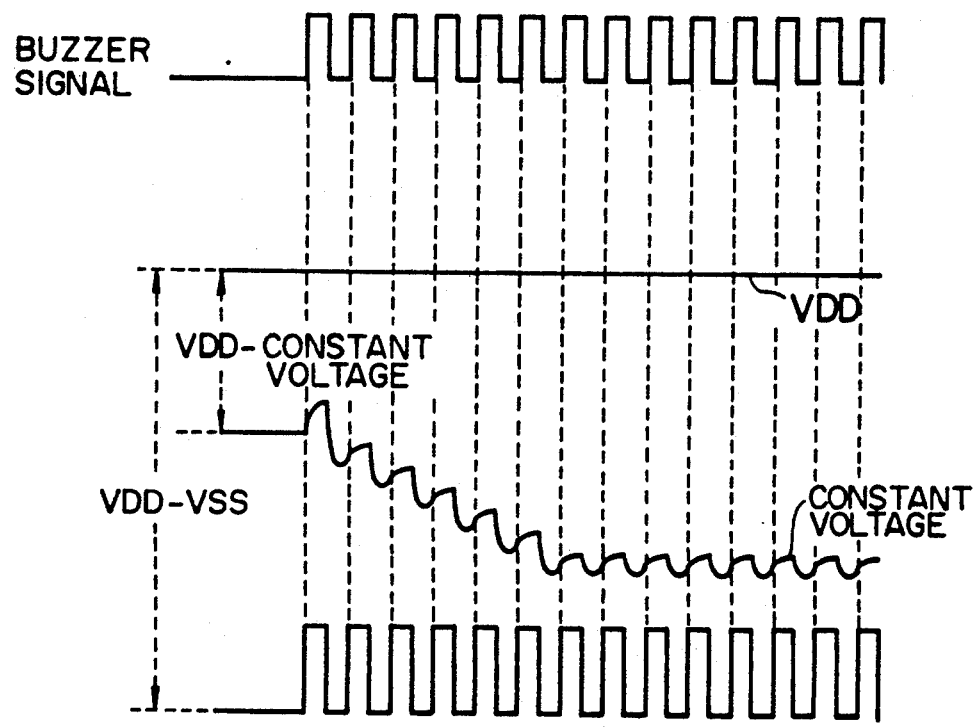

FIGS. 3 and 4 are timing charts showing the constant voltage output when the frequency of fluctuations of the source voltage is high. The constant voltage output is pulled toward the $V_{SS}$ side as the time passes, and the constant voltage output is saturated in a certain condition so as not to be further pulled toward the VSS side while it pulsates simply.

In such a case, therefore, the average constant voltage output becomes higher than that in normal time. The conventional constant voltage circuit has therefore a problem in that the output voltage thereof cannot be kept stable in heavy load driving. For example, when the constant voltage output is used for liquid crystal display, the display is deteriorated during the buzzing operation because the display contrast becomes so intensive.

Thus, the conventional IC and the problem thereof have been made apparent, and referring to the drawings, then, the preferred embodiments of the present invention will be described hereunder.

Figure 5:
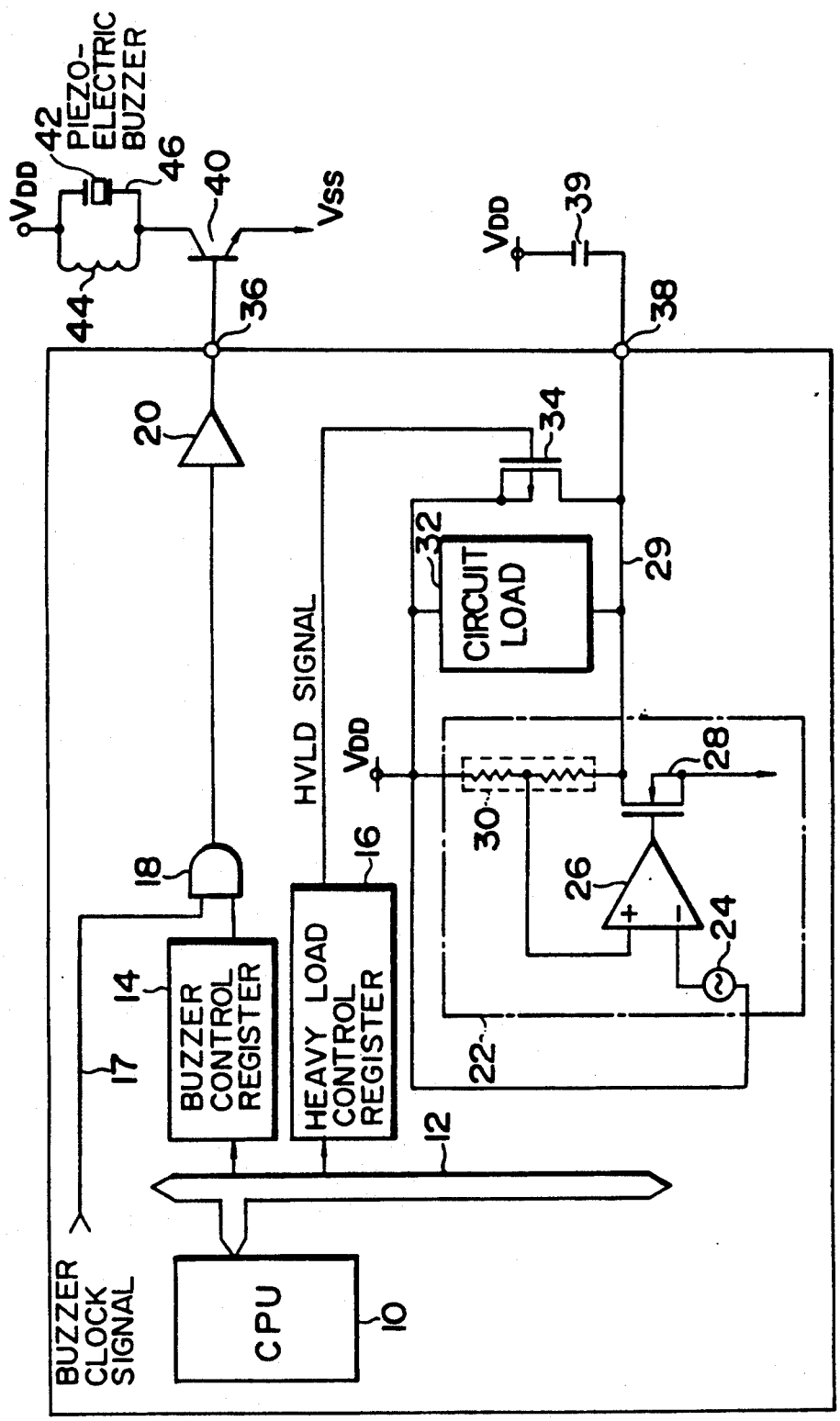
FIG. 5 is a circuit diagram of an embodiment of the IC according to the present invention.

FIG. 5 is a circuit diagram of an embodiment of the IC according to the present invention. A CPU 10 sets signals to a buzzer control register 14 and a heavy load control register 16 respectively through a data bus 12 when the CPU 10 drives a heavy load with a predetermined frequency. The buzzer control register 14 supplies a gate signal to an AND gate 18. When the AND gate 18 is opened by the gate signal, a buzzer clock signal 17 is supplied to a buzzer driver 20 through the AND gate 18 so as to be amplified by the buzzer driver 20. The output of the buzzer driver 20 is supplied to a transistor 40 through a buzzer output terminal 36 so as to drive the transistor 40. A buzzer circuit 46 constituted by a piezo-electric buzzer 42 and a boosting coil 44 sounds when the transistor 40 is driven.

A constant voltage circuit 22 is constituted by a reference voltage generator 24, a differential amplifier 26, a mono-channel output driver 28, and a negative feedback amplifier portion 30. A circuit load 32 and a PMOS output driver 34 are connected between a $V_{DD}$ terminal and an output 29 of the constant voltage circuit 22. The output 29 of the constant voltage circuit 22 is connected to a constant voltage output terminal 38. A capacitor 39 is connected between another voltage source $V_{DD}$ and the terminal 38. For example, a liquid crystal display circuit (not shown) or the like is connected to the constant voltage output terminal 38.

Figure 6:
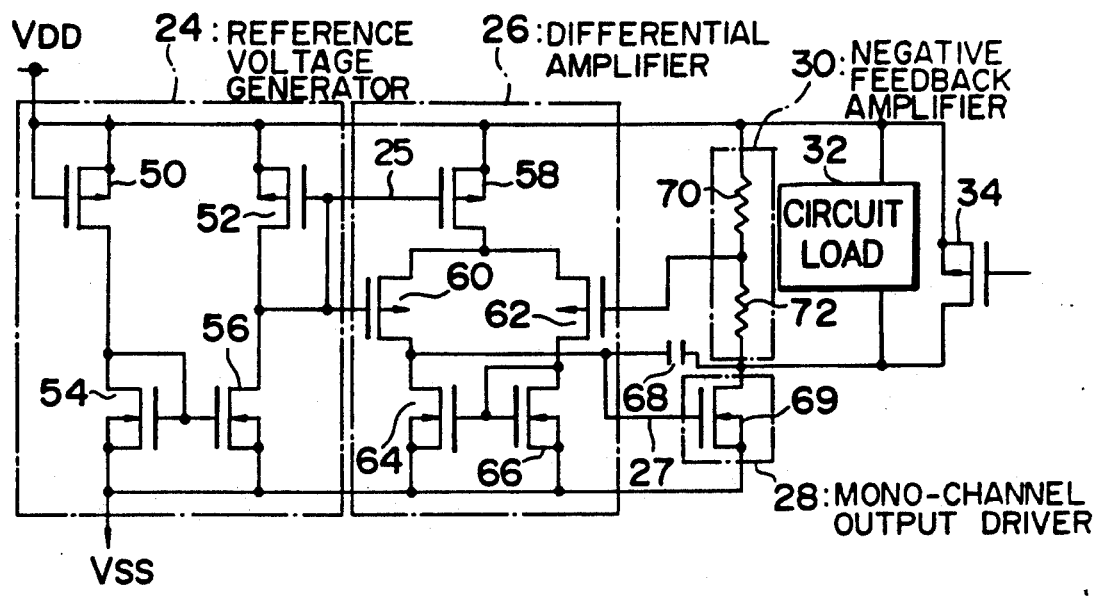
FIG. 6 is a circuit diagram of the constant voltage circuit of FIG. 5.

FIG. 6 is a circuit diagram showing the constant voltage circuit 22 of FIG. 5 more in detail. The circuit per se is the same as the conventional circuit shown in FIG. 1. The reference voltage generator 24 is constituted by a depression type PMOS transistor 50, an enhancement type PMOS transistor 52, and enhancement type NMOS transistors 54 and 56. The differential amplifier circuit 26 is constituted by enhancement type PMOS transistors 58, 60, and 62 and enhancement type NMOS transistors 64 and 66. In this embodiment, the PMOS output driver 34 is connected in parallel to the circuit load 32. The PMOS output driver 34 is driven in accordance with signal of the heavy load control registor 16. That is, when the IC drives a heavy load such as the buzzer 46, the CPU 10 sets "1" in the heavy load control registor 16 so as to supply the "1" to a gate of the PMOS output driver 34 to thereby drive the PMOS output driver 34 so as to turn the PMOS output driver 34 on.

Accordingly, similarly to the case shown in FIG. 2, when a source voltage VDD-VSS returns from its lower value to its original value, the gate voltage of the mono-channel output driver 28 becomes high, and the driving ability thereof becomes large so that the output voltage thereof is pulled toward the $V_{SS}$ side. However, because the PMOS output driver 34 is in its on-state, providing a resistive circuit for discharging a charge in a capacitance 68 of the circuit per se and a change in a capacitive component of the circuit load 32 is formed to thereby rapidly discharge those charges so that the gate voltage of the mono-channel output driver 28 returns to a value corresponding to the output voltage thereof. Accordingly, even if the source voltage periodically fluctuates, although the output voltage is once pulled toward the $V_{SS}$ side, the output voltage is returned toward the $V_{DD}$ side because the PMOS output driver 34 is its on-state as described above. Accordingly, the absolute value of the constant voltage output does not become accumulatively large, but it merely pulsates about a related output as a reference value, so that a stable output can be obtained.

Figure 7:
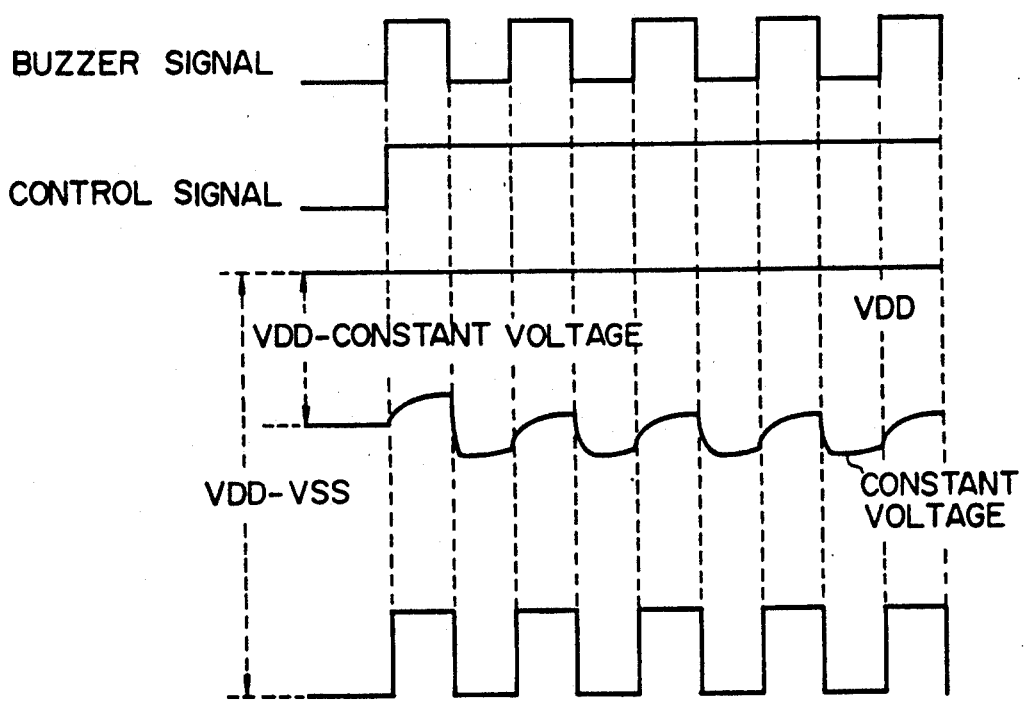
FIGS. 7 and 8 are timing charts showing the operation of the constant voltage circuit of FIG. 6.
Figure 8:
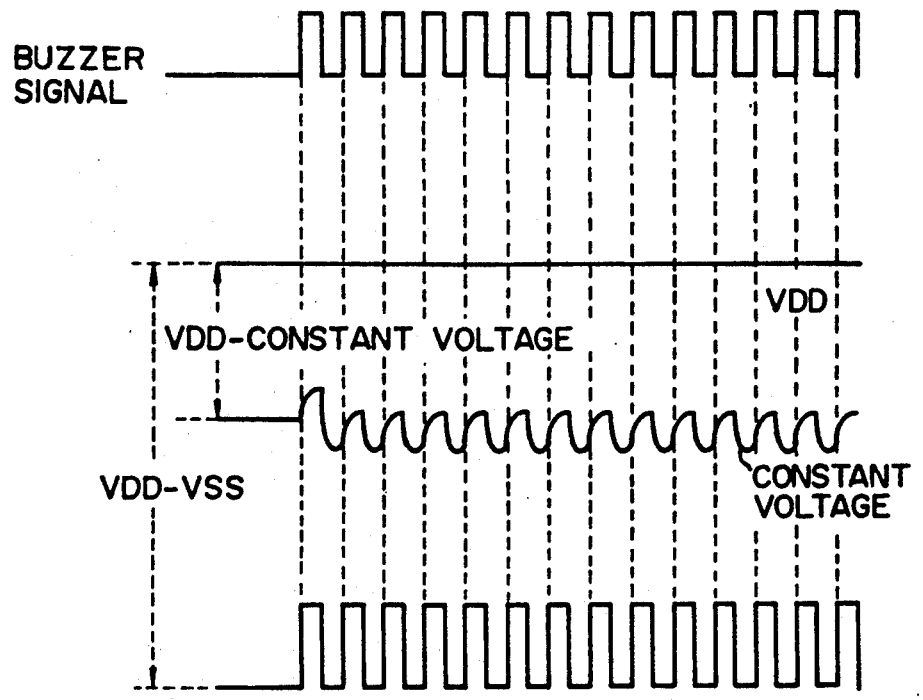

FIGS. 7 and 8 are timing charts showing the operation in the case of a heavy load. As described above, it is found that the absolute value of the constant voltage output does not become accumulatively large.

Figure 9:
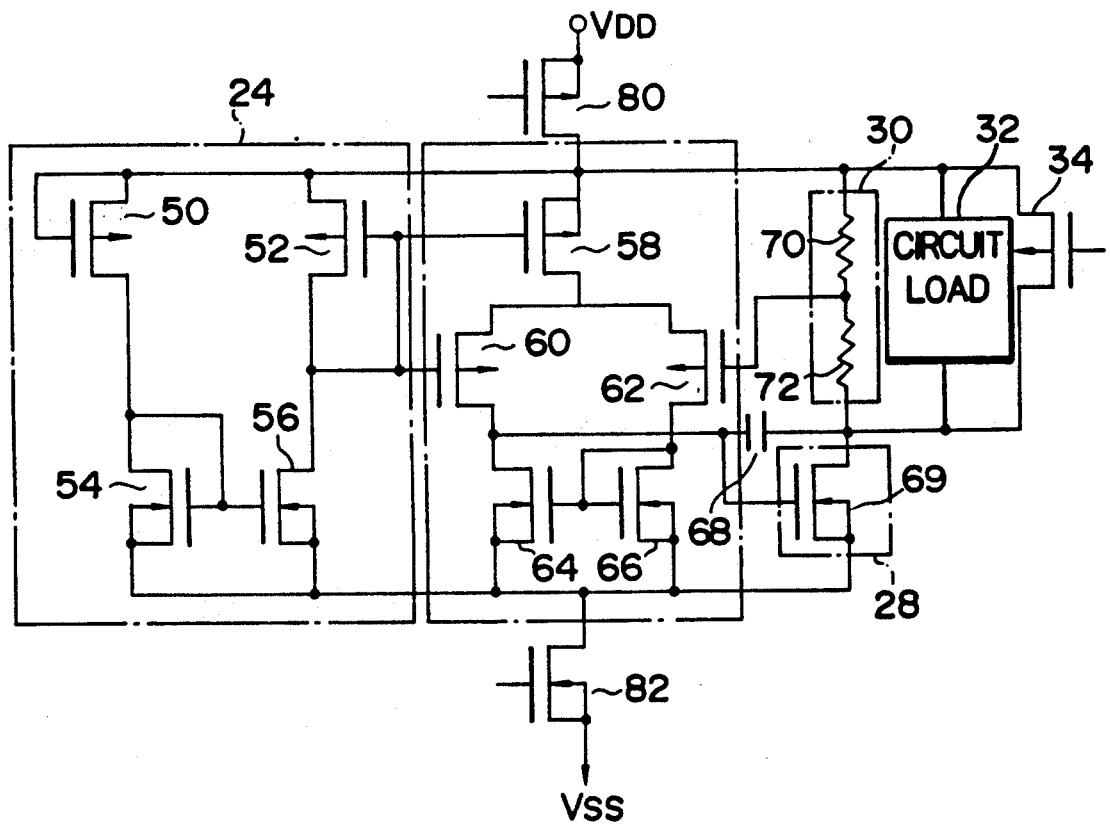
FIG. 9 is a circuit diagram of another embodiment of the constant voltage circuit according to the present invention.

FIG. 9 is a circuit diagram of another embodiment of the IC according to the present invention. In this embodiment, power switches 80 and 82 are added to the embodiment of FIG. 6 in order to perform test of the IC or realize more reduction of current consumption.

Although the current consumption of the IC increases because a PMOS driver 34 is in its on-state while a heavy load is being driven, the heavy load driving which generates fluctuations in source voltage is only in the buzzing operation of a buzzer or lighting operation of a lamp or an LED. Taking the current consumption in the whole of the system into consideration, the increase of the current consumption due to the turning-on of the PMOS driver 34 is negligibly small.

Further, the circuit for controlling the PMOS driver 34 is not limited to the above-mentioned heavy load control registor 16 but any other circuit, for example, a flip-flop circuit, may be used so long as the circuit can latch a control signal.

Further, although the above embodiments have been described with respect the constant voltage circuit for producing a constant voltage with the voltage $V_{DD}$ as a reference as an example, it is a matter of course that similarly to the above case, the present invention can be applied to a constant voltage circuit in which the voltage $V_{SS}$ is used as a reference.

The IC according to the present invention is specifically effective for use in a microcomputer for a clock.

What is claimed is:

1. An integrated circuit including a function for generating a constant voltage comprising:

a constant voltage circuit including a reference voltage generating circuit having an output signal, a feedback circuit for outputting the voltage applied to a circuit load as the feedback voltage, a differential amplifier having a first input for receiving an output signal of said reference voltage generating circuit as a reference signal and a second input for receiving said output of said feedback circuit, and a mono-channel output driver driven by an output of said differential amplifier;

said circuit load connected between both polar terminal of the power source through said mono-channel output driver; and an MOS transistor connected in parallel to said circuit load; and a latch circuit for latching an instruction from an instruction generating means and for driving said MOS transistor when an instruction for a periodic drive for heavy load is received.

2. An integrated circuit according to claim 1 wherein said differential amplifying circuit comprises:

a) a first first-conductive-type MOS transistor having a source connected to one of said poles of said power source and said output voltage from the reference voltage generating circuit being supplied to a gate;

b) a second first-conductive-type MOS transistor of which a source is connected to a drain of said first first-conductive-type MOS transistor and the output voltage from the reference voltage generating circuit is supplied to a gate;

c) a third first-conductive-type MOS transistor of which a source is connected to said drain of said first first-conductive-type MOS transistor and the feedback voltage from said feedback circuit is supplied to a gate;

d) a first second-conductive-type MOS transistor of which a source is connected to the other of said poles of said power source, a drain is connected to a drain of said second first-conductive-type MOS transistor and a voltage having the same potential as that of the drain of said third first-conductive-type MOS transistor is supplied to a gate; and e) a second second-conductive-type MOS transistor of which a source is connected to said other of said poles of said power source, a drain being connected to a drain of said third first-conductive-type MOS transistor and a voltage having the same potential as that of the drain of said third first-conductive-type MOS transistor is supplied to a gate;

wherein said mono-channel output drive is constructed by a third second-conductive-type MOS transistor of which a source is connected to said other one of said poles of said power supply, a gate is connected to the drain of said second first-conductive-type MOS transistor and said gate of said third first-conductive-type MOS transistor and wherein a capacitor is connected between the gate of said third second-conductive-type MOS transistor and the drain thereof.

3. An integrated circuit according to claim 2 said MOS transistor connected in parallel to said circuit load is constituted by a fourth first-conductive-type MOS transistor having a source connected to one of the poles of said power source and a drain connected to said third second-conductive-type MOS transistor.

4. An integrated circuit according to claim 3, further comprising a switching means for turning ON/OFF at least one of said first and second poles of the power source.

5. An integrated circuit according to claim 4, in which said switching means is constituted by an MOS transistor.

6. An apparatus comprising:
an integrated circuit including:
a CPU for processing various operations,
a constant voltage circuit having a reference voltage generating circuit, a feedback circuit for outputting the voltage applied to a circuit load as the feedback voltage, a differential amplifying circuit for inputting and amplifying the voltage outputted from said reference voltage generating circuit and said feedback voltage and a mono-channel output drive driven by the output from said differential amplifying circuit, said circuit load being connected between both polar terminals of the power source through said mono-channel output driver, an MOS transistor connected in parallel to said circuit load, and a first latch circuit for memorizing instructions and for driving said MOS transistor when a periodic drive for a heavy load is instructed by a said CPU; and a heavy load connected to said integrated circuit and driven in accordance with a control command from said CPU.

7. An apparatus according to claim 6 in which said constant voltage circuit of integrated circuit and said heavy load are both connected to one and the same electric source.

8. An apparatus according to claim 6 wherein said integrated circuit has a second latch circuit for memorizing the control instruction from said CPU and for driving said heavy load.

9. An apparatus according to claim 8 in which said heavy load is a buzzer circuit.

10. An apparatus according to claim 9 in which said integrated circuit further comprises a gate circuit for inputting the output of the second latch circuit and a plus signal of a predetermined frequency and for sending a signal for driving said heavy load through the amplifier.

* * * * *